(12) United States Patent
Chen et al.

(10) Patent No.: US 8,815,735 B2
(45) Date of Patent: Aug. 26, 2014

(54) SEMICONDUCTOR DEVICE AND METHOD OF MANUFACTURING THE SAME

(75) Inventors: Yi Jung Chen, New Taipei (TW); Kuo Hui Su, Taipei (TW); Chiang Hung Lin, New Taipei (TW)

(73) Assignee: Nanya Technology Corporation, Tao-Yuan Hsien (TW)

( * ) Notice: Subject to any disclaimer, the term of this patent is extended or adjusted under 35 U.S.C. 154(b) by 0 days.

(21) Appl. No.: 13/463,004

(22) Filed: May 3, 2012

(65) Prior Publication Data

US 2013/0292799 A1    Nov. 7, 2013

(51) Int. Cl.
*H01L 21/44* (2006.01)

(52) U.S. Cl.
USPC ........... 438/652; 438/657; 438/672; 438/674; 438/675; 257/742; 257/743; 257/748; 257/E21.507; 257/E21.658

(58) Field of Classification Search
None
See application file for complete search history.

(56) References Cited

U.S. PATENT DOCUMENTS

| | | | |
|---|---|---|---|
| 6,030,894 A * | 2/2000 | Hada et al. | 438/675 |
| 6,399,488 B2 | 6/2002 | Shin et al. | |
| 6,544,822 B2 * | 4/2003 | Kim et al. | 438/142 |
| 6,844,259 B2 * | 1/2005 | Cheong | 438/657 |
| 6,869,874 B2 * | 3/2005 | Kim et al. | 438/652 |
| 6,933,228 B2 * | 8/2005 | Cheong | 438/637 |
| 7,411,239 B2 * | 8/2008 | Lee et al. | 257/298 |
| 7,579,249 B2 | 8/2009 | Kim et al. | |
| 2003/0005881 A1 * | 1/2003 | Shin | 117/97 |

* cited by examiner

*Primary Examiner* — Zandra Smith
*Assistant Examiner* — Khanh Duong
(74) *Attorney, Agent, or Firm* — Ming Chow; Sinorica, LLC (57) ABSTRACT

A semiconductor device comprises a substrate, a dielectric layer, an undoped silicon layer, and a silicon material. The substrate comprises a doped region. The dielectric layer is formed on the substrate and comprises a contact hole, and the contact hole corresponds to the doped region. The undoped silicon layer is formed on the doped region. The silicon material fills the contact hole from the undoped silicon layer.

5 Claims, 10 Drawing Sheets

SEMICONDUCTOR DEVICE AND METHOD OF MANUFACTURING THE SAME

BACKGROUND OF THE INVENTION

1. Technical Field

The present invention relates to a semiconductor device and a method for manufacturing the same.

2. Background

In DRAM (Dynamic Random Access Memory) units, defective components (i.e., the transistor and the capacitor) can cause charge to leak into or from capacitors and destroy the information inside the memory cells. To avoid losing information, the DRAM memory cells need to be frequently refreshed.

The leakage of charge may occur from a capacitor to the substrate, or through the access transistor. The latter phenomenon, referred to as "sub-threshold leakage," occurs because the channel of the field effect access transistor can never be rendered entirely non-conducting by the gate voltage. Charge leakage is a long-term issue and needs an effective solution.

In addition, a contact plug is used to connect a source/drain region to a component such as a capacitor or a digit line in a DRAM. The contact plug may be formed with metal or doped SEG (selective epitaxial growth) silicon material as shown in U.S. Pat. No. 6,399,488 B2. The SEG silicon contact plug in U.S. Pat. No. 6,399,488 B2 has two portions. The first portion is formed by simultaneously performing a selective epitaxial growth process and a thermally doping process. The second portion is formed by performing a selective epitaxial growth process until the second portion is completely formed, and then a doping process is performed. Phosphorus is used as the doping impurity. However, if phosphorus diffuses from the contact plug to the source/drain regions, the doping concentration of the source/drain regions may be increased. Moreover, the growth of the SEG silicon layer is difficult to control. If the SEG silicon layer is formed too thin, the uniformity of the SEG silicon layer is poor; if the SEG silicon layer is formed too thick, two adjacent SEG contact plugs may connect to each other.

SUMMARY

One embodiment discloses a semiconductor device. The semiconductor device may comprise a substrate, a dielectric layer, an undoped silicon layer, and a silicon material. The substrate may comprise a doped region. The dielectric layer may be formed on the substrate and comprise a contact hole, where the contact hole corresponds to the doped region. The undoped silicon layer may be formed on the doped region. The silicon material may fill the contact hole from the undoped silicon layer.

One embodiment discloses a method of manufacturing a semiconductor device. The method comprises forming a dielectric layer on a substrate including a doped region; forming a contact hole on the dielectric layer corresponding to the doped region; performing a selective epitaxial growth process to form a silicon layer on the doped region of a substrate; and filling the contact hole from the silicon layer by a silicon material.

Another embodiment discloses a semiconductor device. The semiconductor device comprises a plurality of pairs of word lines, a plurality of pairs of digit lines, a plurality of silicon pillars, a dielectric layer, an undoped silicon layer, and a silicon material. The plurality of pairs of digit lines may be formed below the plurality of pairs of word lines. Each silicon pillar may comprise a doped region. Each silicon pillar may couple with a corresponding pair of word lines and a corresponding pair of digit lines. The dielectric layer may be formed on the plurality of silicon pillars. The undoped silicon layer may be formed from the doped regions. The silicon material may fill the contact holes from the undoped silicon layer.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated with the following description and upon reference to the accompanying drawings in which.

DETAILED DESCRIPTION

Figure 1:
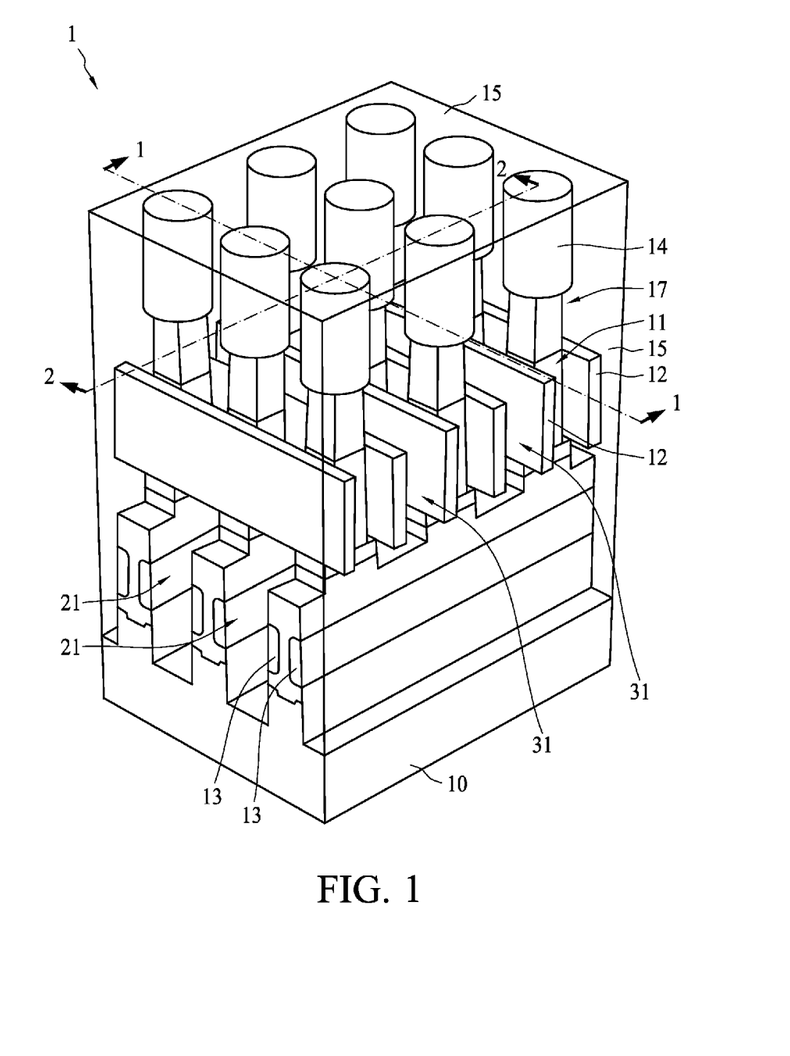
FIG. 1 is a perspective view schematically showing a semiconductor device according to one embodiment of the present invention.

FIG. 1 is a perspective view schematically showing a semiconductor device 1 according to one embodiment of the present invention. As shown in FIG. 1, the semiconductor device 1 comprises a plurality of transistors each formed using a corresponding silicon pillar 11. The silicon pillars 11 are formed from a substrate 10. Each silicon pillar 11 has a number of sides and comprises first and second source/drain regions (or doped regions). The semiconductor device 1 comprises a plurality of pairs of word lines 12 and a plurality of pairs of digit lines 13 formed below the word lines 12. The word lines 12 may extend orthogonally to the digit lines 13. Each silicon pillar 11 is formed between and couples with the corresponding pair of word lines 12 each including a gate region of the silicon pillar 11. One of the first and second source/drain regions of each silicon pillar 11 electrically connects to a corresponding capacitor 14, and the other electrically connects to the corresponding pair of digit lines 13. Dielectric material 15 is filled in the spaces among the silicon pillars 11, word lines 12, digit lines 13, and capacitors 14.

Figure 7:
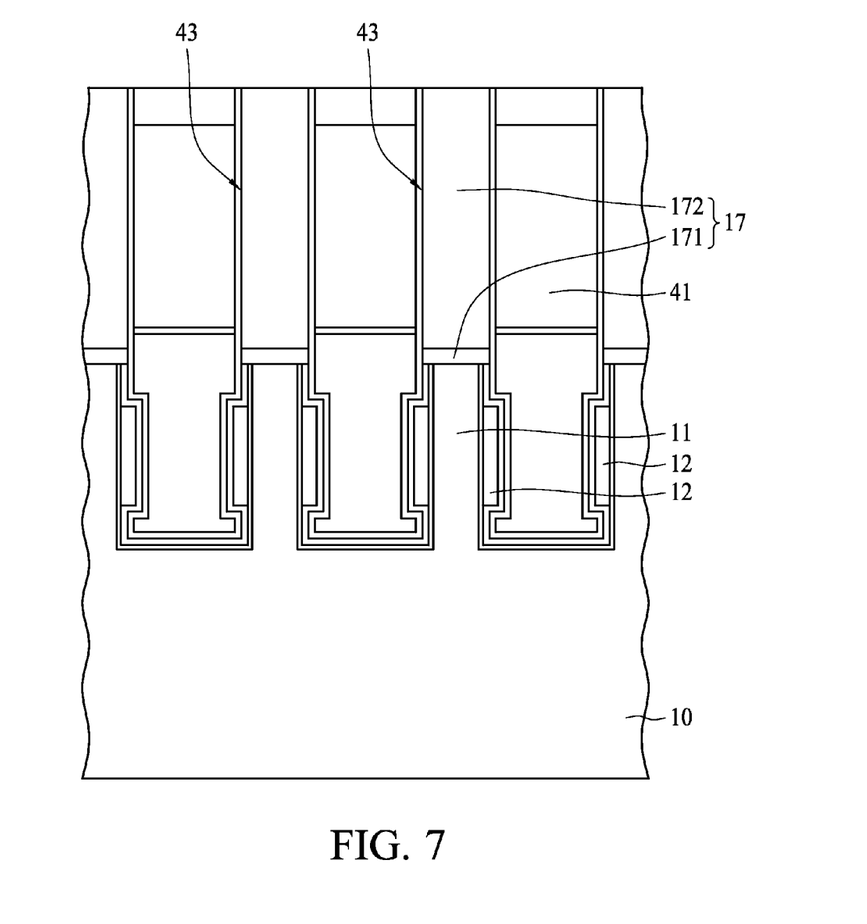

Referring to FIGS. 1 and 7, the semiconductor device 1 comprises a dielectric layer 41 included in the dielectric material 15 and formed on the silicon pillars 11. The dielectric layer 41 may be made of silicon dioxide, silicon nitride or other suitable materials. A plurality of contact holes 43 is formed on the dielectric layer 41, corresponding to one doped region of the corresponding silicon pillar 11. In the contact holes 43, an undoped silicon layer 171 may be directly formed on the exposed doped regions of the silicon pillars 11. A silicon material 172 may fill the contact holes 43 from the undoped silicon layer 171 to electrically couple to capacitors 14.

The silicon material 172 may comprise polysilicon. The silicon material 172 may comprise doped polysilicon. The silicon material 172 may comprise phosphorus doped polysilicon. The concentration of phosphorous in the silicon material 172 may be at least 1E21 atoms/cm$^2$. The silicon material 172 may have a thickness of from 80 nanometers to 160 nanometers.

The undoped silicon layer 171 may be epitaxial to the substrate. The undoped silicon layer 171 may comprise SEG silicon. The undoped silicon layer 171 may have a thickness in a range of from 30 nanometers to 50 nanometers. The undoped silicon layer 171 can prevent the diffusion of the phosphorous in the silicon material into the doped regions of the silicon pillars 11. Further, the undoped silicon layer 171 may also reduce the leakage of charge occurring through transistors.

Figure 2:
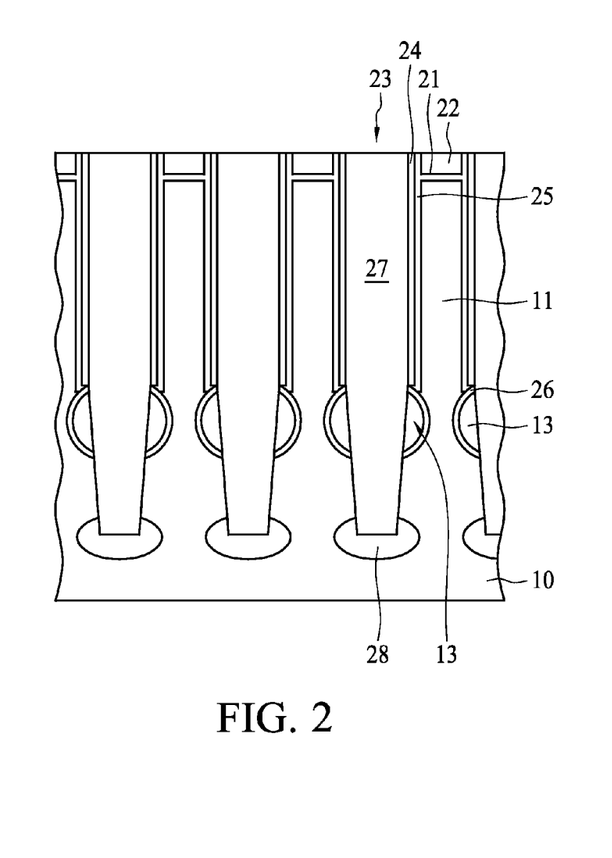
FIGS. 2 through 7 schematically demonstrate the steps of a method of manufacturing a semiconductor device according to one embodiment of the present invention.

FIGS. 2 through 7 schematically demonstrate the steps of a method of manufacturing a semiconductor device 1 according to one embodiment of the present invention. FIG. 2 is a cross-sectional view taken along line 1-1 of FIG. 1 and schematically demonstrating some steps of the method of manufacturing the semiconductor device 1. As shown in FIGS. 1 and 2, a silicon oxide layer 21 and a silicon nitride layer 22 are deposited on the substrate 10. Through several suitable processes, a plurality of trenches 23 are formed in the substrate 10. In each trench 23, a silicon nitride layer 24 and a silicon oxide layer 25 are on each side surface of the trench.

The trenches 23 are then deepened. Next, a p-type impurity such as boron is implanted into locations 28 below the bottoms of the deepened trenches 23. Moreover, digit lines 13 are formed into or indented in the side surfaces of the deepened portions of the trenches 23, wherein each digit line 13 is formed on a barrier layer 26. In one embodiment, the digit line 13 comprises titanium nitride (TiN), and the barrier layer 26 comprises titanium silicide (TiSi$_2$). Next, a dielectric material 27 fills the trenches 23.

Figure 3:
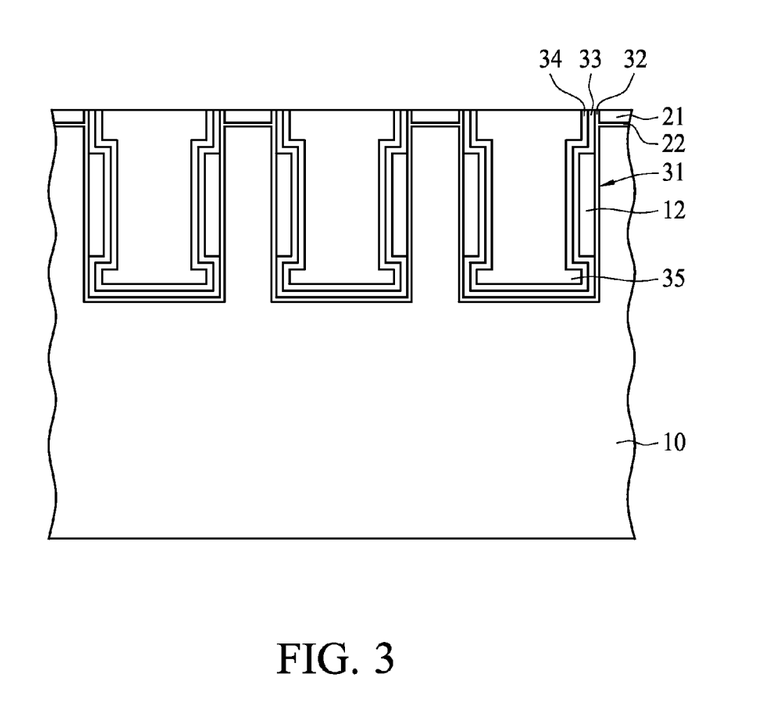

FIG. 3 is a cross-sectional view taken along line 2-2 of FIG. 1 and schematically demonstrating some steps of the method of manufacturing the semiconductor device 1. Referring to FIGS. 1 and 3, trenches 31 are formed in the substrate 10. The trenches 31 may be orthogonal to the trenches 23 shown in FIG. 2. In each trench 31, a silicon oxide layer 32 is formed on the side surfaces and the bottom surface. A portion of the silicon oxide layer 32 can be used as the gate oxide. Two word lines 12 are then formed in each trench 31, on the side surfaces defining the trench 31. Subsequently, a silicon dioxide layer 33 and a silicon nitride layer 34 are formed, covering the side and bottom surfaces defining the trench 31. Finally, a dielectric material 35 such as silicon dioxide fills the trenches 31.

In one embodiment, the word line 12 may comprise titanium nitride. In other embodiments, the word line 12 may be formed using other suitable materials.

Figure 4:
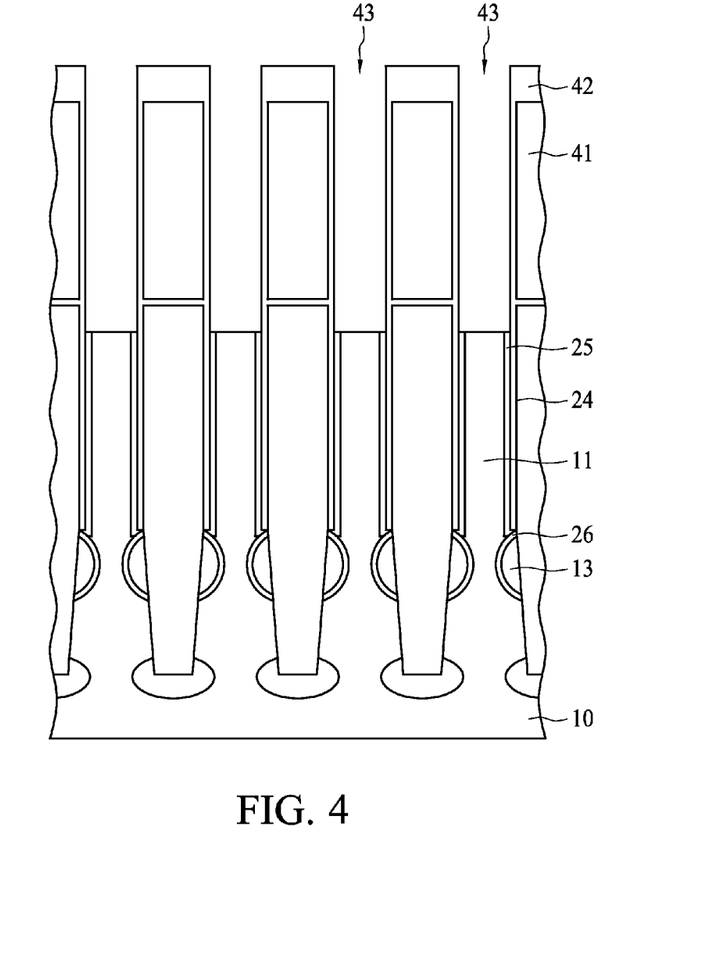
Figure 5:
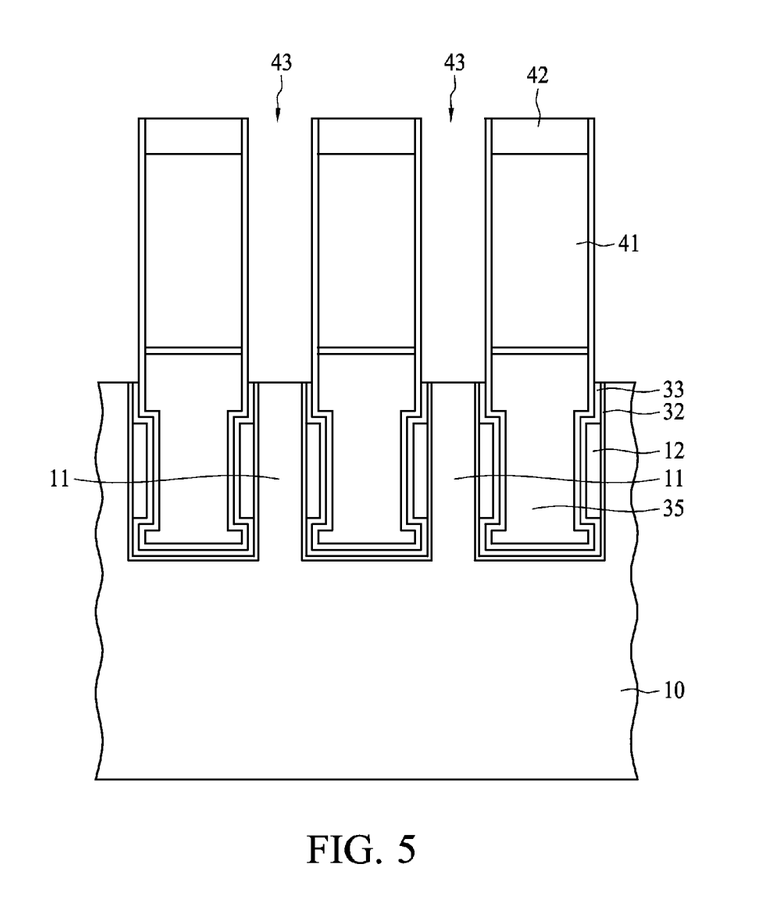

As shown in FIGS. 4 and 5, after the formation of word lines 12, the silicon nitride layer 22 is removed, and a dielectric layer 41 is formed on the substrate 10. After that, a plurality of contact holes 43 are formed on the dielectric layer 41 corresponding to the silicon pillars 11, exposing the upper doping regions. Next, another silicon nitride layer 42 is deposited on the substrate 10. In one embodiment, the dielectric layer 41 may comprise silicon dioxide. In another embodiment, the dielectric layer 41 may comprise silicon nitride.

Figure 6:
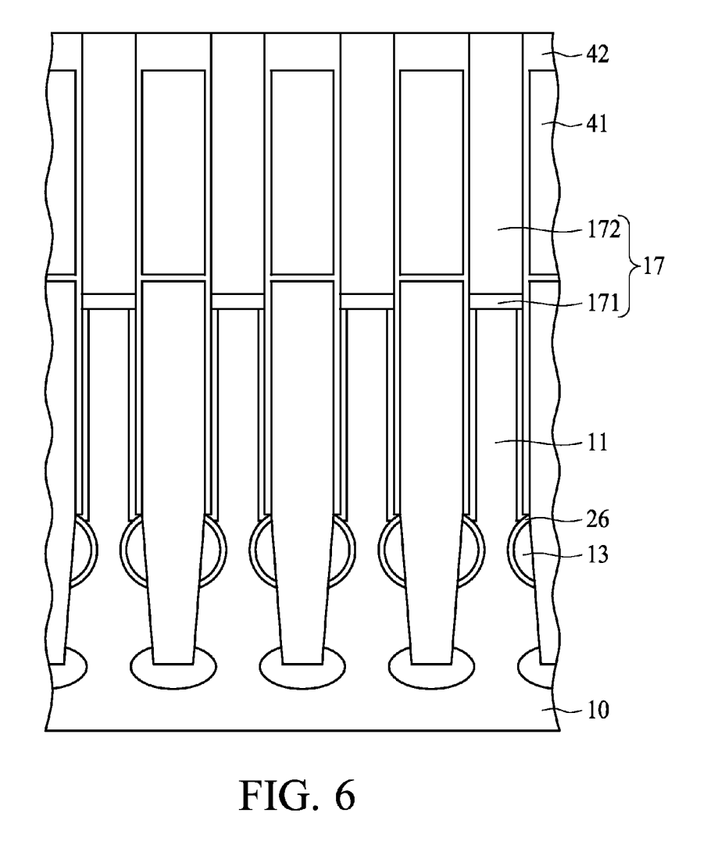

Referring to FIGS. 6 and 7, an undoped silicon layer 171 is then formed on the doped regions of the silicon pillars 11. The undoped silicon layer 171 may be epitaxial to the substrate 10. In one embodiment, the undoped silicon layer 171 is formed using a selective epitaxial growth process.

In one embodiment, the undoped silicon layer 171 can be formed to have a thickness of from 30 nanometers to 50 nanometers such that the thickness variation of the undoped silicon layer 171 can be less than or equal to 10%.

In one embodiment, the undoped silicon layer 171 comprises SEG silicon. The SEG silicon may be formed at a temperature of from 800 to 900 degrees Celsius under a pressure of from 60 Torr to 100 Torr with the introduction of DCS (SiH$_2$Cl$_2$) and hydrogen chloride gases. In one embodiment, the SEG silicon is formed at a temperature of from 800 to 900 degrees Celsius under a pressure of from 60 Torr to 100 Torr with the introduction of DCS (SiH$_2$Cl$_2$) gas of 50 to 200 sccm (standard cubic centimeters per minute) and hydrogen chloride gas of 50 to 200 sccm.

Thereafter, a silicon material 172 is applied to fill the contact holes 43. In one embodiment, the silicon material 172 comprises polysilicon. In one embodiment, the silicon material 172 comprises doped polysilicon. In one embodiment, the doped polysilicon may comprise phosphorus-doped polysilicon. In one embodiment, the silicon material 172 is highly doped with phosphorus impurities. In one embodiment, the silicon material 172 is doped to at least 1E21 atoms/cm$^2$. In one embodiment, the silicon material 172 comprises in-situ phosphorus doped polysilicon. Specifically, the contact holes 43 are filled by the silicon material 172 with simultaneous incorporation of a dopant, i.e. phosphorus, into the deposited silicon material layer.

In one embodiment, the silicon material 172 may be formed to have a thickness of from 80 nanometers to 160 nanometers.

After the contact holes 43 are filled, capacitors 14 can be formed, electrically connecting to silicon material 172 of corresponding contact holes 43.

Figure 8:
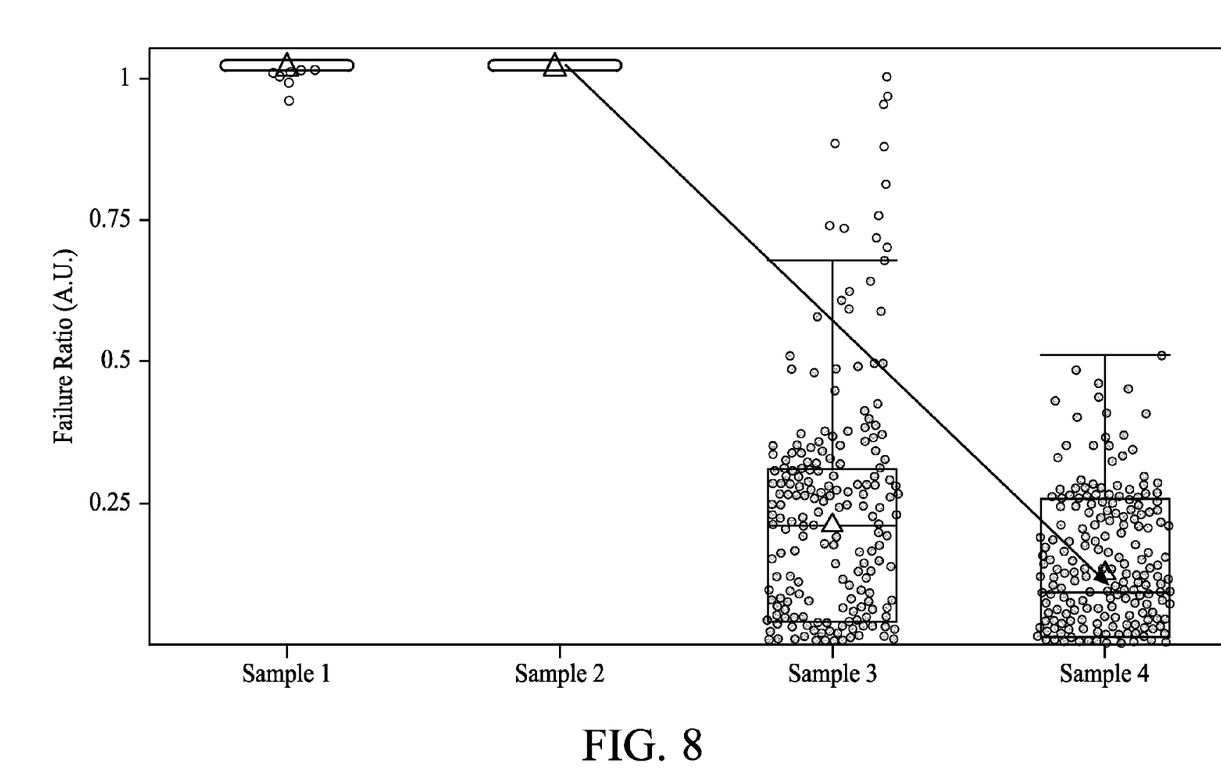
FIG. 8 is a diagram showing the improvement in charge leakage according to one embodiment of the present invention.

FIG. 8 is a diagram showing the reduction in charge leakage according to one embodiment of the present invention. As shown in FIG. 8, Sample 1 and Sample 2 are formed without a SEG silicon layer in their contact holes. Sample 3 has a SEG silicon layer with a thickness of 50 nanometers in its contact holes. Sample 4 has a SEG silicon layer with a thickness of 30 nanometers in its contact holes. A junction leakage test is performed on Samples 1 through 4. It can be seen that Samples 3 and 4 have significantly lower failure ratios. Sample 3 has an improvement of approximately 80% over Samples 1 and 2. Sample 4 has an improvement of approximately 90% over Samples 1 and 2.

Figure 9:
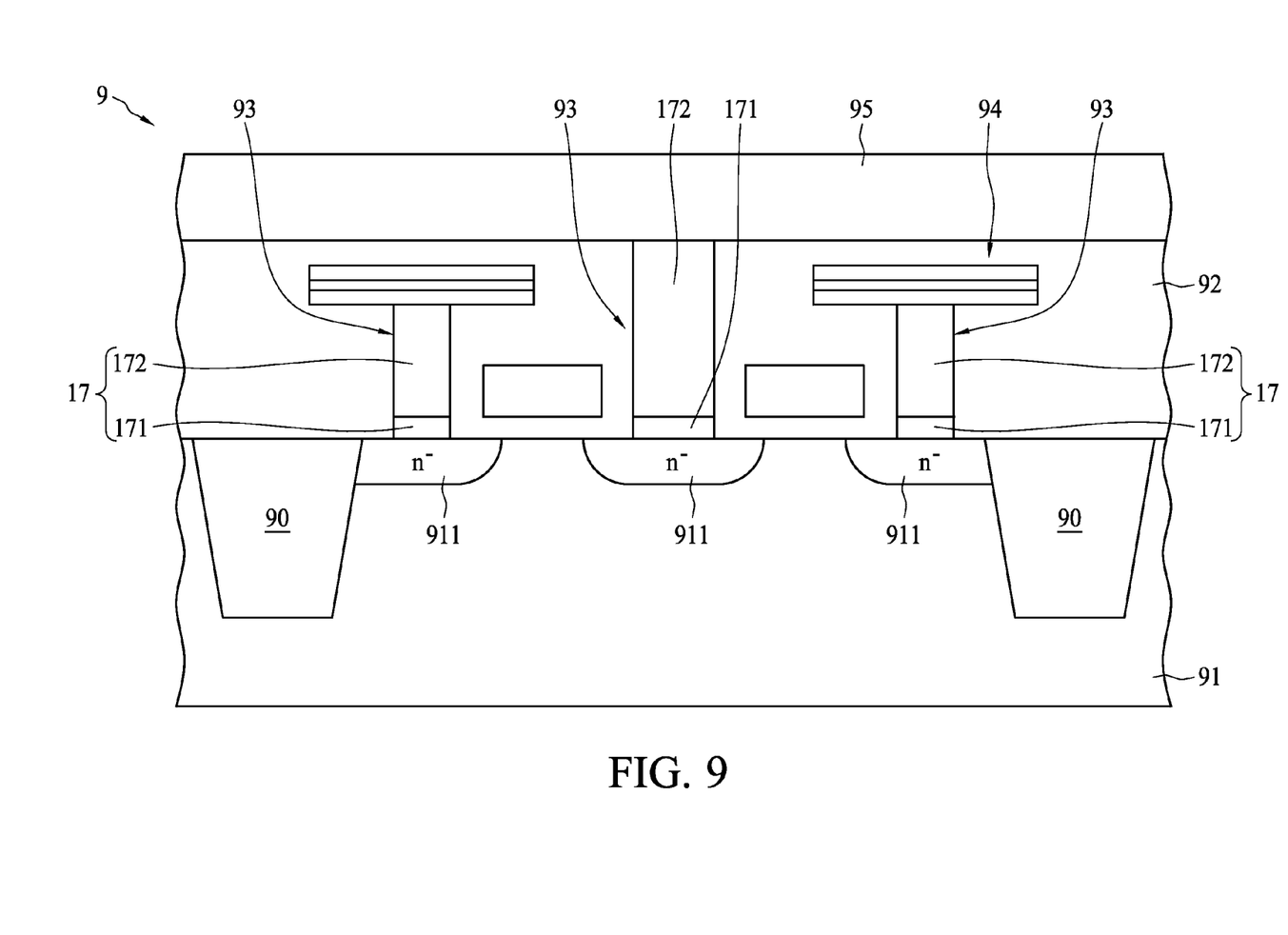
FIG. 9 schematically demonstrates a semiconductor device according to another embodiment of the present invention.

FIG. 9 schematically demonstrates a semiconductor device 9 according to another embodiment of the present invention. The contact structure 17, including the undoped silicon layer 171 and the silicon material 172, may be applied to the semiconductor devices having different configurations or other types of semiconductor devices other than memory devices. Referring to FIG. 9, the semiconductor device 9 comprises a substrate 91. The substrate 91 comprises an active area (AA) defined by trench isolations 90 including doped regions 911. Similarly, a dielectric layer 92 is formed on the substrate 91. Contact holes 93 are formed on the dielectric layer 92 with respect to the doped regions 911. Selective epitaxial growth process is applied to form the undoped silicon layer 171, and a silicon material is filled into the contact holes 93. Subsequently, capacitors 94 and bit lines are formed and electrically connecting the silicon material in corresponding contact holes 93.

Figure 10:
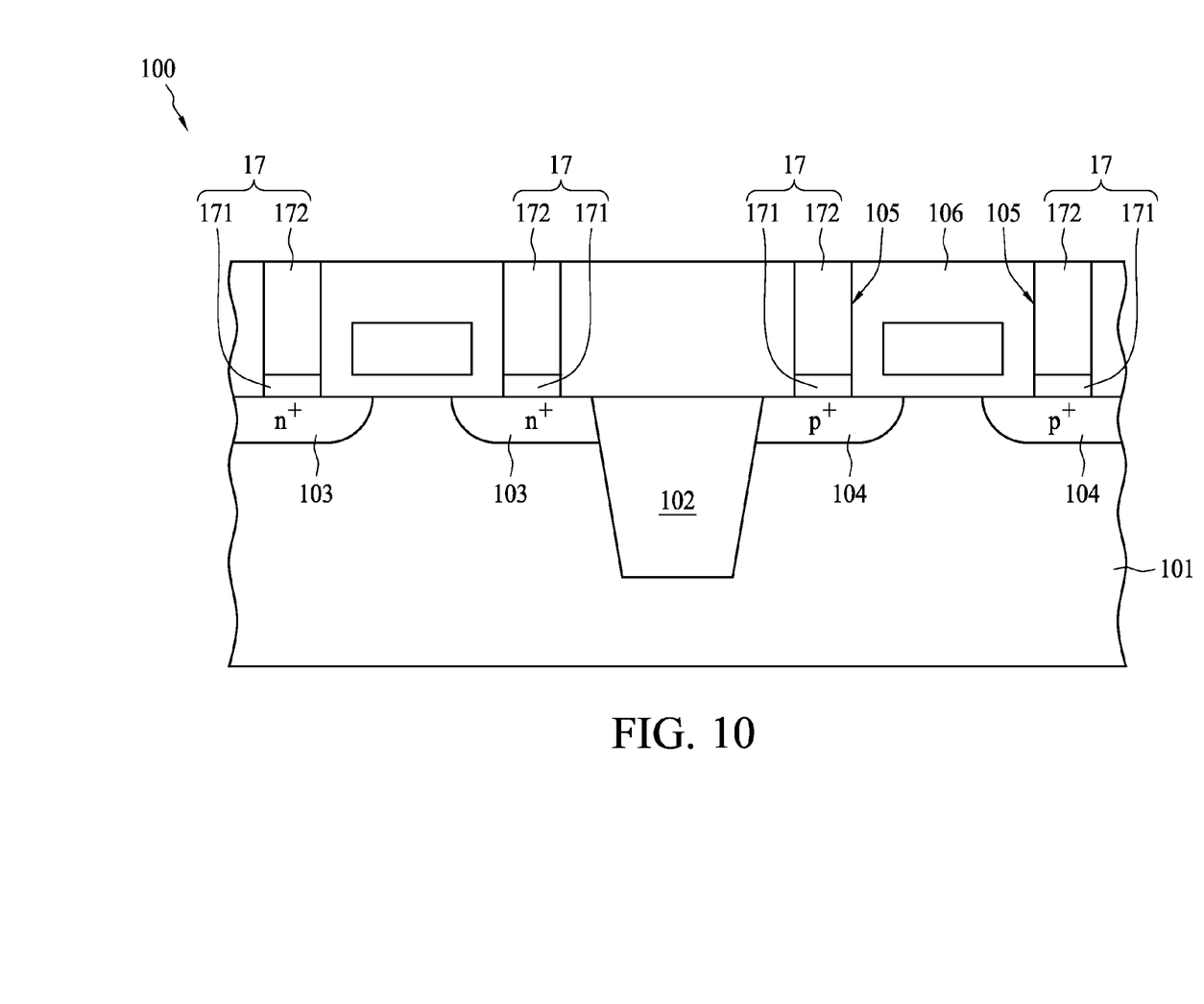
FIG. 10 schematically demonstrates contact structures being applied in the transistors at a peripheral circuit region of a memory device according to one embodiment of the present invention.

FIG. 10 schematically demonstrates contact structures are applied in the semiconductor devices at a peripheral circuit region of a memory device according to one embodiment of the present invention. As shown in FIG. 10, a peripheral circuit region of a substrate 101 comprises a trench isolation 102 and a plurality of doped regions 103 and 104. Contact holes 105 are formed with respect to the doped regions 103 and 104 on a dielectric layer 106 disposed on the substrate 101. An undoped silicon layer 171 is formed from the doped regions 103 and 104 using a selective epitaxial growth process, and silicon material 172 fills the contact holes 105.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, comprising the steps of:
    forming a plurality of pairs of digit lines and a plurality of pairs of word lines in a substrate, wherein the digit lines are formed below the word lines;
    forming a plurality of silicon pillars in the substrate, wherein each silicon pillar couples with a corresponding pair of word lines and a corresponding pair of digit lines;
    forming a dielectric layer on the silicon pillar;
    forming a contact hole on the dielectric layer corresponding to the silicon pillar;
    performing a selective epitaxial growth process to form a silicon layer on the silicon pillar, wherein the selective epitaxial growth process is performed at a temperature of from 800 to 900 degrees Celsius under a pressure of from 60 Torr to 100 Torr, with introduction of DCS ($SiH_2Cl_2$) gas of 50 to 200 sccm and hydrogen chloride gas of 50 to 200 sccm, and not to form the silicon layer on the sidewall of the contact hole; and
    filling the contact hole from the silicon layer by a silicon material.

2. The method of claim 1, wherein the step of filling the contact hole comprises a step of filling the contact hole from the silicon layer by the silicon material with simultaneous incorporation of a dopant into a deposited silicon material layer.

3. The method of claim 2, wherein the dopant comprises phosphorus.

4. The method of claim 1, wherein the silicon layer has a thickness in a range of from 30 nanometers to 50 nanometers.

5. The method of claim 1, wherein the silicon material is deposited to a thickness of from 80 nanometers to 160 nanometers.

\* \* \* \* \*